United States Patent [19]

Fujiwara et al.

[11] Patent Number: 4,621,406
[45] Date of Patent: Nov. 11, 1986

[54] ELECTRONIC COMPONENT INSERTION APPARATUS

[75] Inventors: Koji Fujiwara, Nara; Yoshinobu Maeda, Osaka, both of Japan

[73] Assignee: Matsushita Electric Industrial Co., Ltd., Osaka, Japan

[21] Appl. No.: 582,967

[22] Filed: Feb. 23, 1984

[30] Foreign Application Priority Data

Feb. 28, 1983 [JP] Japan ................................. 58-32235
Dec. 5, 1983 [JP] Japan ................................ 58-229316

[51] Int. Cl.⁴ .............................................. H05K 3/32
[52] U.S. Cl. ................................. 29/564.2; 29/566.3; 29/739
[58] Field of Search ...................... 29/739, 741, 564.2, 29/566.2, 566.3

[56] References Cited

U.S. PATENT DOCUMENTS

| | | | |
|---|---|---|---|
| Re. 27,968 | 4/1974 | Ragard et al. | 227/90 |
| 2,902,689 | 9/1959 | Petersen | 29/741 |
| 2,982,967 | 5/1961 | Dingelstedt | 227/90 |
| 3,078,466 | 2/1963 | Harrold et al. | 227/85 |
| 3,401,548 | 9/1968 | Ross et al. | 29/741 |
| 3,740,817 | 6/1973 | Weiler et al. | 29/739 |
| 3,793,708 | 2/1974 | Watanabe | 29/568 |
| 4,205,433 | 6/1980 | Araki et al. | 29/566.2 |
| 4,417,683 | 11/1983 | Lewis et al. | 29/741 |

*Primary Examiner*—Gil Weidenfeld
*Assistant Examiner*—Daniel W. Howell
*Attorney, Agent, or Firm*—Amster, Rothstein & Ebenstein

[57] ABSTRACT

An electronic component insertion apparatus for automatically inserting various types and sizes of electronic components having axially extending leads into a printed circuit board having a compact, light-weight insertion head with a first and a second set of cutting, shaping and insertion tools mounted therein. The apparatus includes means mounted remote from the insertion head for adjusting the distance between the first and second sets of tools and for rotating the insertion head about an axis substantially perpendicular to the plane of the printed circuit board.

9 Claims, 21 Drawing Figures

ELECTRONIC COMPONENT INSERTION APPARATUS

BACKGROUND OF THE INVENTION

The present invention relates to an improved apparatus for automatically inserting various types and sizes of electronic components having axially extending lead wires into predetermined apertures in a printed circuit board. Specifically, the apparatus of the present invention includes a lightweight, compact insertion head which has automatically adjustable pairs of cutting, bending and insertion tools to enable the machine to first cut and bend the axially extending lead wires and then to automatically insert components having different bent lead spacings into the proper location on a printed circuit board.

Automatic electronic component insertion apparatus are well known. Conventional apparatus for continuously and automatically inserting different types of electronic components having axially extending lead wires such as resistors and diodes, can be classified into two categories; those having fixed insertion tools and those having adjustable insertion tools. Each of these categories can be further divided into two sub-categories according to the way the electronic components are fed into the apparatus. One sub-category of machines feeds the different types of electronic components arranged in a preset order, for example, on a taped band, to the insertion head for successive insertion. The second sub-category of insertion machines utilizes a plurality of feed assemblies, with each assembly including one type of electronic component. The appropriate component is then successively selected in the order of insertion and conveyed to the insertion head by a belt, pipe or other means.

The former sub-category has the disadvantage that since the different electronic components are arranged sequentially in taped, banded form in the order of insertion, if a failure of insertion occurs, if the next component is merely inserted the order of insertion will be incorrect. Such disadvantage is not present in the second sub-category of machines having a plurality of feed assemblies since each feed assembly has only type of component. Therefore, it is possible to merely feed the next component from the same feed assembly. However, a disadvantage of some machines using a plurality of feed assemblies is that the insertion head structure is so large or complex that the components must be fed to the insertion head by conveyor or tube. Such transfer tends to cause rotation or tilting of the components making it difficult to feed them into the insertion head in a stabilized manner. Further, transfer by tube or conveyor often results in a time delay that affects the remainder of the feed cycle or, if parts are prefed and arranged in the order of insertion, in the tube or conveyor so they are immediately available, by virtue of the prefeeding, the same disadvantage as found in the sequential feed machines will be present.

New types of insertion appatus which eliminate the drawbacks of both sub-categories of machines are available. For example, the apparatus disclosed in U.S. Pat. No. 4,205,433 has a compact insertion head which can be mounted directly adjacent a component feed assembly which includes means for arranging and holding a plurality of taped assemblies of the same type of electronic components and means for moving one of the component feed assemblies to a predetermined component feed position in response to an instruction. The compact insertion head is adapted to travel between the component feed position and a second position adjacent to a printed circuit board. The insertion head directly receives a single electronic component cut off from the electronic component assembly. The insertion head moves to the second position where the axial leads of the component are bent and the component is inserted into the printed circuit board.

A disadvantage of the apparatus of U.S. Pat. No. 4,205,433 is that it has fixed insertion tools and cannot readily insert different types of components having body portions of different shapes and size or lead wires of different diameters since the distance between the leads (or the "lead pitch") after bending is not the same for all components due to such variables in component and lead dimensions. Thus, when it is desirable to insert different types of electronic components in a continuous process, such equipment cannot be used. Instead, component insertion apparatus having adjustable insertion tools must be utilized.

U.S. Pat. No. 3,167,780 discloses a component insertion apparatus in which the insertion head is adjustable to enable the apparatus to insert components having different spacing between their bent leads. Specifically the adjustment is accomplished by replacing the inserting tools and changing the spacing of both pairs of cutting and bending tools relative to the centerline by activating adjustment screws manually. The disadvantage of such apparatus is that the machine must be stopped, disassembled and reassembled before components having different bent lead spacing or pitch can be inserted.

U.S. Pat. No. 2,982,967 discloses a component insertion apparatus which has a split or two-part insertion tool which initially bends and thereafter inserts the bent leads into corresponding holes in a printed circuit board. The insertion is followed by cutting and clinching of the inserted lead ends from the underside of the printed circuit board. Because the apparatus utilizes a split or two-part insertion tool, the pairs of ganged bending and inserting tools can be adjusted relative to each other to achieve the desired lead and hole spacing. The adjustment is accomplished by a single lead screw having oppositely threaded sections which may be manually adjusted by turning one or the other of the adjustment knobs. Such adjustment causes both parts of the insertion tool to move about the centerline. Since the adjustment of the tool spacing must be made manually, the apparatus is not automatic.

U.S. Pat. No. 3,078,466 discloses an adjustable component inserting machine in which the lead cutting operation occurs after the leads have been bent and inserted through the preformed holes in the printed circuit board. In this apparatus, one set of lead working tools (including the lead bending tool and the lead end inserting tool) is adjustable laterally while the other set of lead working tools is stationary. Although the apparatus of this patent moves one set of lead working tools on an automatic basis and in accordance with a program which is predetermined and set up for a particular board design or configuration, since one set of lead working tools is stationary, it is not possible to locate the components of the printed circuit board in their optimum positions. The same disadvantage is present in the apparatus which is the subject of Japanese Patent Publication No. 28604/1964. This publication discloses an adjustable arrangement for varying the pitch of the lead wires to be inserted into apertures in a printed circuit board. The apparatus comprises a pair of forming elements for bending lead wires to form parallel ends wherein one of the elements are fixed and the other is moveable.

Another adjustable component insertion equipment is disclosed in U.S. Pat. No. Re. 27,968 (formerly U.S. Pat. No. 3,539,086). Such apparatus is constructed to insert different types and sizes of electronic components delivered to the insertion head in the order of insertion in banded form. The insertion head has cutting, bending and insertion means which are adjustable relative to each other to accomodate electronic components which should be shaped with different lead pitch. The spacing between the tools is adjusted by a motor mounted on the insertion head itself. Such apparatus has the disadvantage of having a large and complex head resulting from the placement of the motor on the insertion head and has the additional disadvantage inherent in machines having sequential feeders wherein the electronic components are fed from a single taped band in sequential order.

Accordingly, there is a need for an adjustable electronic component insertion machine which is automatically adjustable, yet has a compact design because it does not have the motor mounted on the insertion head, can feed components which are delivered directly to the insertion head at random rather than in fixed sequential arrangement has an insertion head which has insertion tools which are both adjustable relative to the centerline.

There is a further need for an adjustable electronic component insertion machine which is capable of inserting components into a printed circuit board in an orientation rotated through a predetermined angle (e.g. 90°) about an axis perpendicular to the plane of the printed circuit board without having to change the orientation of the printed circuit board itself. Necessarily, such equipment must have an insertion head which is capable of rotating about an axis perpendicular to the plane of the printed circuit board while the printed circuit board remains fixed.

SUMMARY OF THE INVENTION

It is broadly an object of this invention to provide an electronic component insertion machine which fulfills all of the foregoing requirements for such machines. Specifically, it is within the contemplation of this invention to provide an adjustable electronic component insertion machine which has a compact, light weight insertion head which is capable of fast operation due to reduced inertia.

It is a further object of the present invention to provide an adjustable electronic component insertion machine which automatically adjusts the spacing between cutting, bending and insertion tools responsive to preprogramed directions.

It is a still further object of the present invention to provide an electronic component insertion machine which has an insertion head which is rotatable through a preselected angle about an axis perpendicular to the plane of the printed circuit board.

It is a still further object of the present invention to provide an adjustable electronic component insertion apparatus wherein the cutting, bending and insertion tools are adjustable about the center line of the insertion head to allow greatest flexibility in the location and orientation of components to be inserted on the printed circuit board.

It is a still further object of the present invention to provide an adjustable electronic component insertion apparatus which includes a random component feed assembly which feeds the components directly to the insertion head, rather than through a tube or by a conveyor.

In accordance with an embodiment of this invention, there is provided an apparatus for processing electronic components having a pair of axially projecting leads by cutting and bending the leads and thereafter inserting the components by their leads into a corresponding pair of preformed holes in their printed circuit board in a particular, preselected location and orientation relative to the board, having a lead working head for working the leads of the component and for inserting the worked leads into the printed circuit board. The lead working head or insertion head includes first and second sets of lead working and inserting tools, means mounting the sets of tools in the head for adjustment relative to each other about a centerline of the head in accordance with the required spacing between the corresponding pairs of preformed holes in the printed circuit board. Means on the working head are operatively connected to the sets of lead working tools for adjusting the spacing between the same during selected cycles of the machine. A machine control moves the head from a standing position to a feed postion in which the head receives a component for lead working and subsequent insertion into the printed circuit board and an insertion position wherein the lead inserting tools are oriented relative to the printed circuit board for insertion of the leads into the printed circuit board. The improvement in such apparatus comprises a tool spacing adjustment drive with means mounting the drive on the machine remote from the head and means for moving the drive between a clearance position removed from the path of movement of the head and an operative position in engagement with the head when the head is in the standby position. The tool spacing adjustment drive includes means operatively connecting to the tool adjusting means in the insertion head when said drive is in the standby position for connecting the drive to the tool spacing adjustment means whereby the spacing between the first and second sets of lead working and insertion tools is adjusted to correspond to the spacing between the corresponding preformed holes in the printed circuit board.

BRIEF DESCRIPTION OF THE DRAWINGS

These and other objects and features of the present invention will be more fully understood by reference to the following detailed description of the presently preferred, but nonetheless illustrative, electronic component insertion apparatus in accordance with this invention when taken in conjunction with the accompanying drawings, wherein.

DETAILED DESCRIPTION OF THE PREFERRED EMBODIMENT

Figure 1:
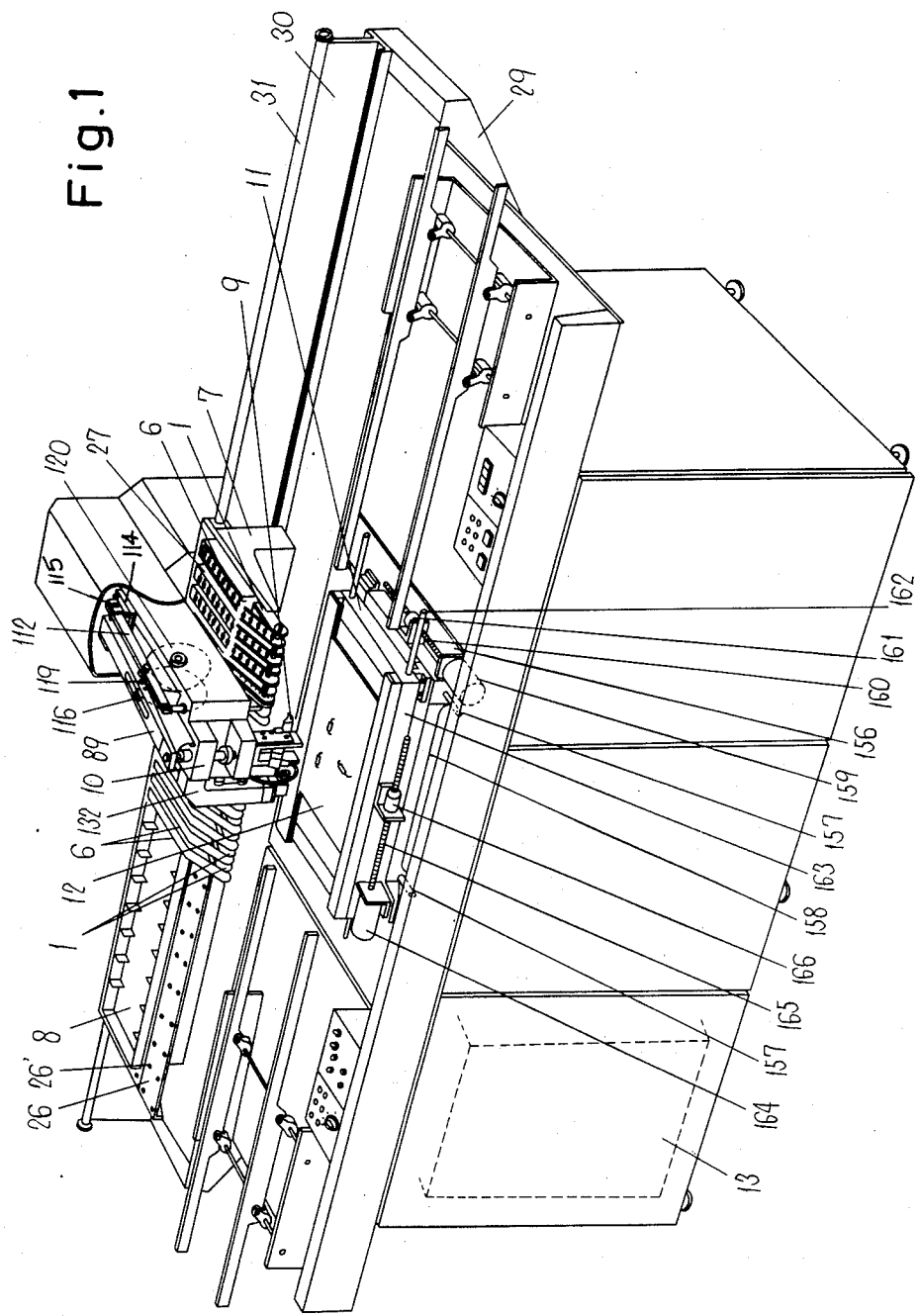
FIG. 1 is a perspective view of an electronic component insertion apparatus according to an embodiment of the present invention.
Figure 2:
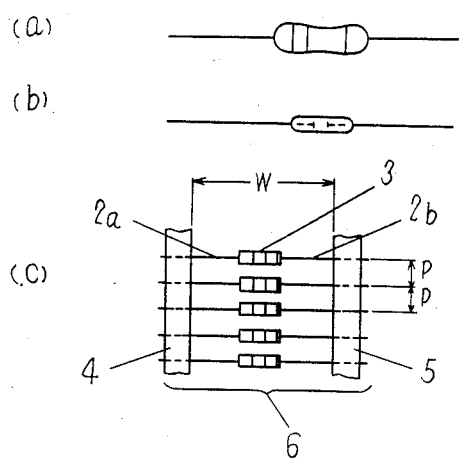
FIG. 2a is a view of an electronic component known as a resistor.
FIG. 2b is a view of an electronic component known as a diode.
FIG. 2c is a view of a band-like electronic component assembly used in an electronic component insertion apparatus according to an embodiment of the present invention.

Referring to the drawings and, in particular, to FIG. 1, there is provided an embodiment of the electronic component insertion machine of the present invention. The electronic component insertion machine is comprised of several major assemblies, namely, the insertion head assembly 10, a unit moving table 7 including a plurality of tape feed units 1, the insertion head 9 including the cutting, bending and inserting units, the printed circuit board moving section or "X-Y table" 11, the drive control section 13 and an overall apparatus body or frame 29.

Each tape feed unit 1 has a band-like electronic component assembly 6 mounted therein. As shown in FIG. 3c, a plurality of equispaced electronic components 3, each having axially extending lead wires to 2a, 2b are affixed in position by bendable tapes 4, 5, such as paper tapes. The electronic component insertion machine of the present invention includes a plurality of tape feed units 1. Each tape feed unit 1 has a corresponding component storing section 8 arranged rearwardly of the tape feed unit 1 which is adapted to store the taped components and feed them to the corresponding tape feed unit 1. A plurality of tape feed units 1 are arranged in side-by-side orientation with corresponding taped components storing sections 8 arranged in a plurality of lines rearwardly of the tape feed units. The assembly comprised of the tape feed units 1 and the corresponding tape component storing sections 8 are mounted to the unit moving table 7 which is adapted to travel back and forth to move any desired tape feed unit 1 to a predetermined component feed position.

The insertion head contains means for cutting off the lead wires of the components from the tapes at the predetermined component take-out position, shaping the lead wires into predetermined form, holding the lead wires guided in guide grooves and moving them in relation to a printed circuit board 12 to insert them into preformed holes in the printed circuit board.

Figure 8:
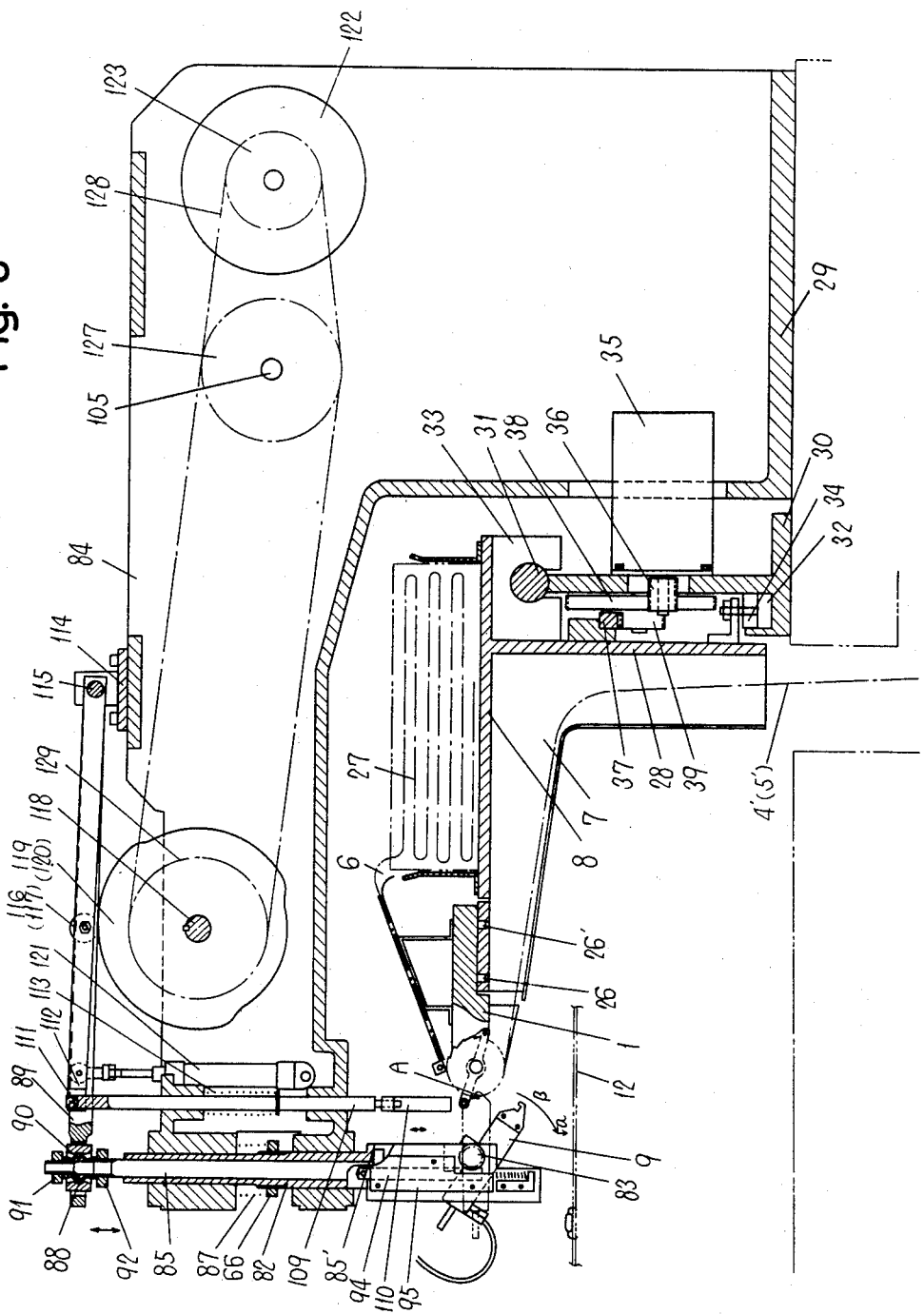
FIG. 8 is a side elevational view, in section, of the electronic component insertion apparatus of the present invention.

An external drive section 132 (best shown in FIG. 9) is constructed and arranged to change the "insertion pitch" or spacing between the shaped lead wires of the insertion head 9 when the insertion head 9 is oriented in the neutral or origin position as shown in FIG. 8. The X-Y table 11 holds the printed circuit board 12. The printed circuit board 12 is clamped in position and moved back and forth in the X and Y direction as described below to align the component held by insertion head 9 to the proper position for the shaped leads to be inserted into preformed holes in the printed circuit board 12. The insertion head 10 can be rotated about an axis substantially perpendicular to the plane of the printed circuit board 12 by the engagement of rack 167 with pinion 82' to enable components to be inserted in varying angular orientations or in relating perpendicular orientations to increase the density of components on a printed circuit board. The rotation of insertion head 9 will be described more fully below by reference to FIGS. 16, 17a and 17b.

A conventional drive control section 13 mounted in the apparatus frame 29 controls the insertion operation of the unit moving table 7, the X-Y table 11 and the insertion head assembly 10.

Referring first to the tape feed unit 1 which is best shown in FIGS. 4, 5, 6 and 7, the same type of components 3 are taped at equal intervals by tapes 4, 5.

Each tape feed unit 1 includes a pair of toothed feed wheels 14, 14' having a plurality of feed teeth spaced apart a distance or pitch P. The band-like component assembly 6 has components spaced thereon at a corresponding distance P (see FIG. 3c), the feed wheels 14, 14' are mounted to a rotary shaft 15 and spaced apart from each other by a distance slightly smaller than the taping inner width W. One end of the rotary shaft 15 has a ratchet wheel 16 attached to it. Rotary wheel 16 has the same number of teeth as the toothed feed wheels 14, 14'. A lever 18 is pivotally mounted on the rotary shaft 15 and has a pawl 17 attached thereto engaging the ratchet wheel 16. The other end of the lever 18 carries a roller 19 for reducing the frictional resistance when the lever 18 is pushed. A spring 20 retains pawl 17 in engagement with ratchet wheel 16 and restores lever 18 to the orientation shown in FIGS. 4 and 6. A ratchet wheel arresting pawl 21 prevents clockwise rotation of the toothed feed wheels 14, 14'.

Figure 4:
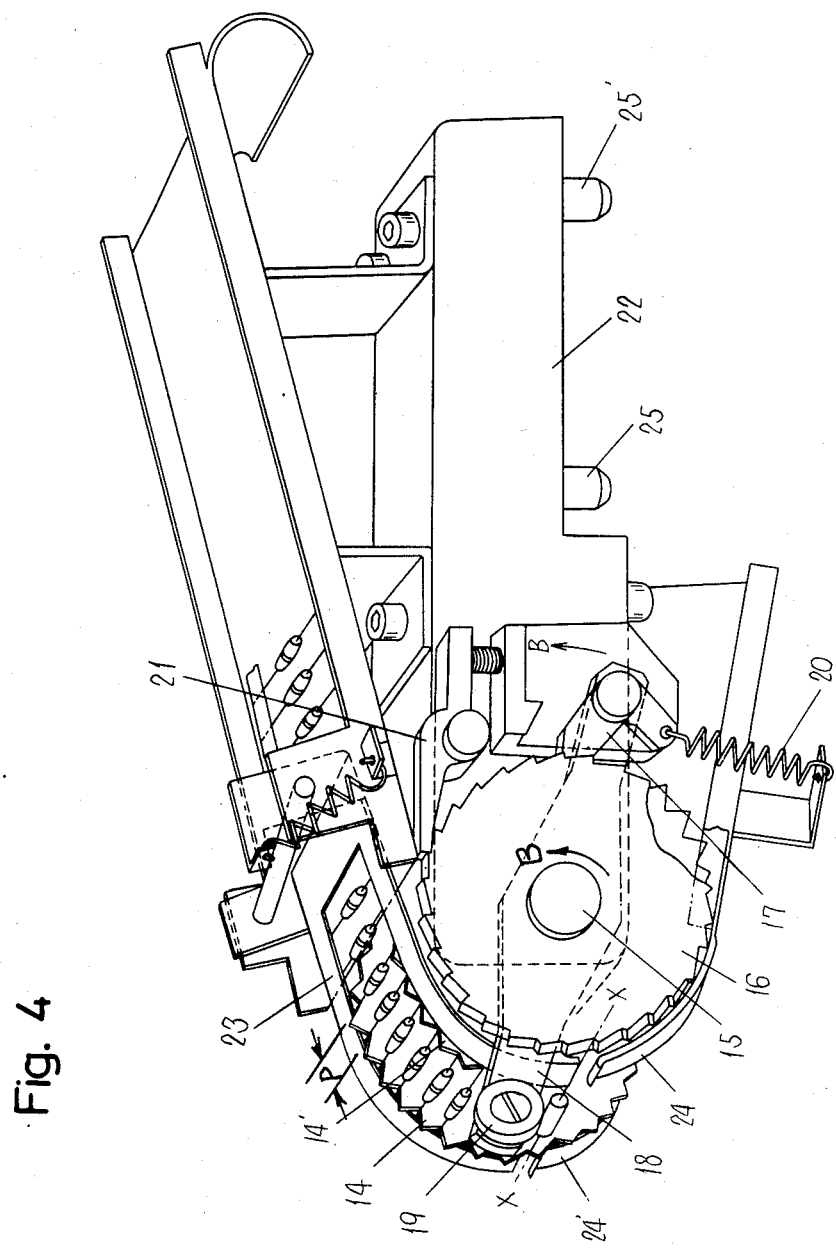
FIG. 4 is an enlarged perspective view of a tape feed unit in the electronic component insertion apparatus of the present invention.
Figure 5:
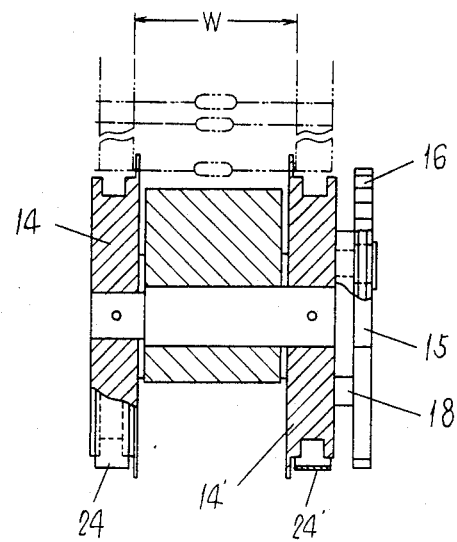
FIG. 5 is a front sectional view of the tape feed unit of FIG. 4.
Figure 6:
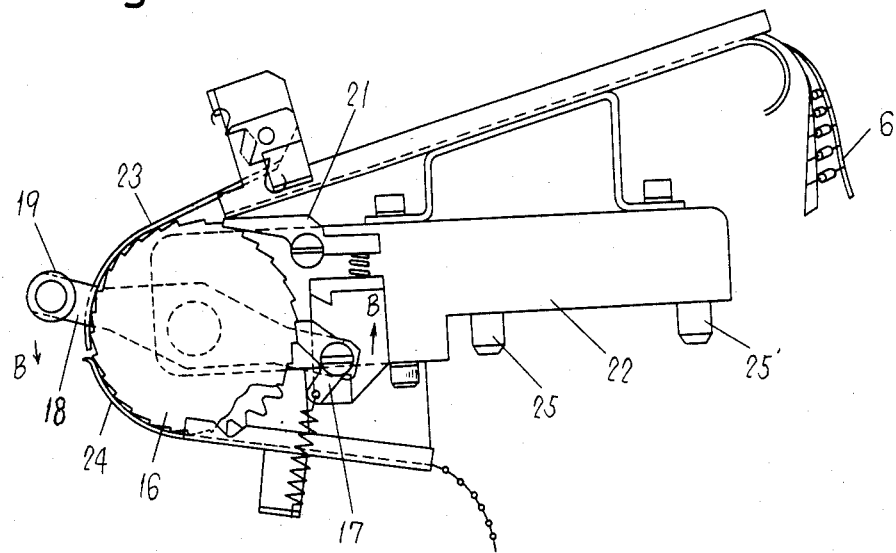
FIG. 6 is a side elevational view of the tape feed unit of FIG. 4.
Figure 7:
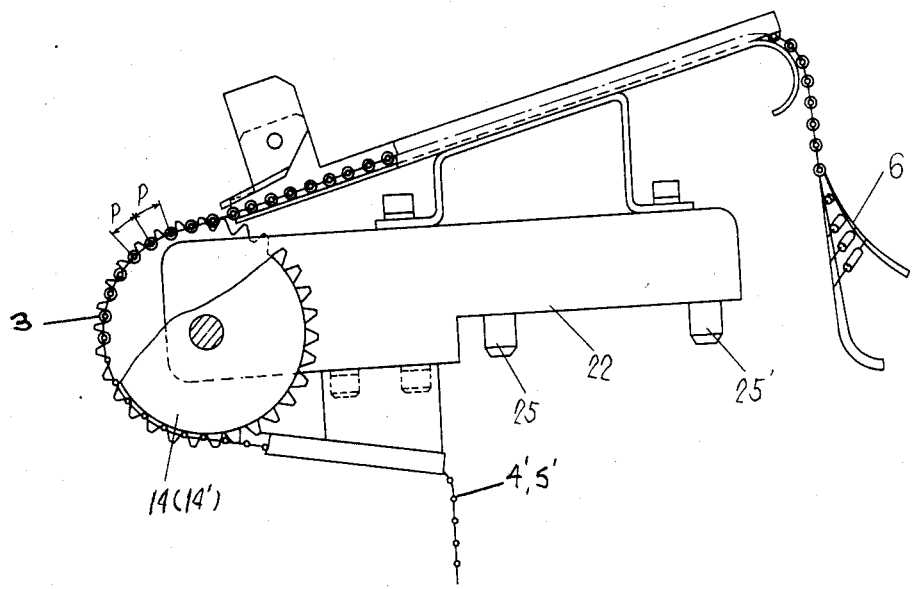
FIG. 7 is a side sectional view of the tape feed unit.

The component feed position is shown by the line X—X' in FIG. 4. When a component is in the component feed position, such component can be engaged by the insertion head 10 and subsequently cut, shaped and inserted. Rotary shaft 15 and its associated toothed feed wheels 14, 14' are supported by the tape feed unit frame 22.

In operation, an electronic component 3 is first delivered to the component feed position X—X'. After the insertion head 9 removes the electronic component 3, as described more fully below, roller 19 is moved downwardly by the engagement of the feed shaft 109 causing lever 18 and rotary shaft 15 to rotate in a counterclockwise direction as shown by the arrow B in FIG. 4. As lever 18 is rotated, pawl 17 engages the ratchet wheel 16 causing corresponding rotation of the ratchet wheel 16 and the toothed feed wheels 14, 14'. Toothed feed wheels 14, 14' and ratchet wheel 16 are constructed and arranged so that counterclockwise rotation of lever 18 moves ratchet wheel 16 and toothed feed wheels 14, 14' through a distance equal to one tooth. Thus the taped components 3 are fed a distance corresponding to the pitch P, so that a new component 3 is moved to the predetermined feed position X—X'. Subsequent taped electronic components 3 are moved on by one to the predetermined component feed position X—X' as required.

Each tape feed unit 1 has a keep plate 23 which prevents the taped component assembly 6 from moving out of engagement with the teeth of toothed feed wheels 14, 14'. Likewise, keep plates 24, 24' are provided for preventing the tapes 4, 5 from rising once the insertion head 9 has cut the component 3 from tapes 4, 5. The keep plates 23, 24, 24' are mounted to the taped feed unit frame 22.

The tape feed unit 1 is provided with fixing pins 25, 25' on its frame so that a plurality of such feed units can be mounted on the unit moving table 7 by engaging the respective fixing pins into holes 26, 26' (FIG. 1) preformed at predetermined intervals of space in the unit moving table 7. Further details of construction of the tape feed unit 1 are set forth in U.S. Pat. No. 4,205,433.

As best shown in FIGS. 1 and 8, the unit moving table 7 has a plurality of tape feed units 1 mounted thereon by the attaching pins 25, 25' and includes a corresponding plurality of tape components storing sections 8. The taped, band-like component assemblies 6 are fed from component boxes 27 in the component storing sections 8.

The unit moving pin body 28 is supported by a parallel slide shaft 30 and a roller groove 32 provided in the parallel slide shaft 30 attached to the apparatus frame 29 through plane bearings 33 and cam followers 34, so that the unit moving table body 28 is slideable on the slide shaft 30.

A pulse motor 35 is provided for driving the tape feed unit moving table 7. The pulse motor 35 is mounted to the parallel slide shaft or rail 30. The pulse motor 35 has an output pinion gear 36 which engages idler gears 38 and 39, which in turn engage rack 37 mounted to the moving table body 28. Tapes and feed units that are selected by the drive control section 13 are successively transferred to the front of the insertion head 10 by rotation of the drive pulse motor 35.

Subsequently, the band-like component assembly 6 is cut by a cutter (as described hereinafter) and thereby separated into the electronic components 3 and the remaining tape scrap portions 4', 5'. The tape scraps become longer and longer and flow downwardly under the influence of gravity.

Figure 9:
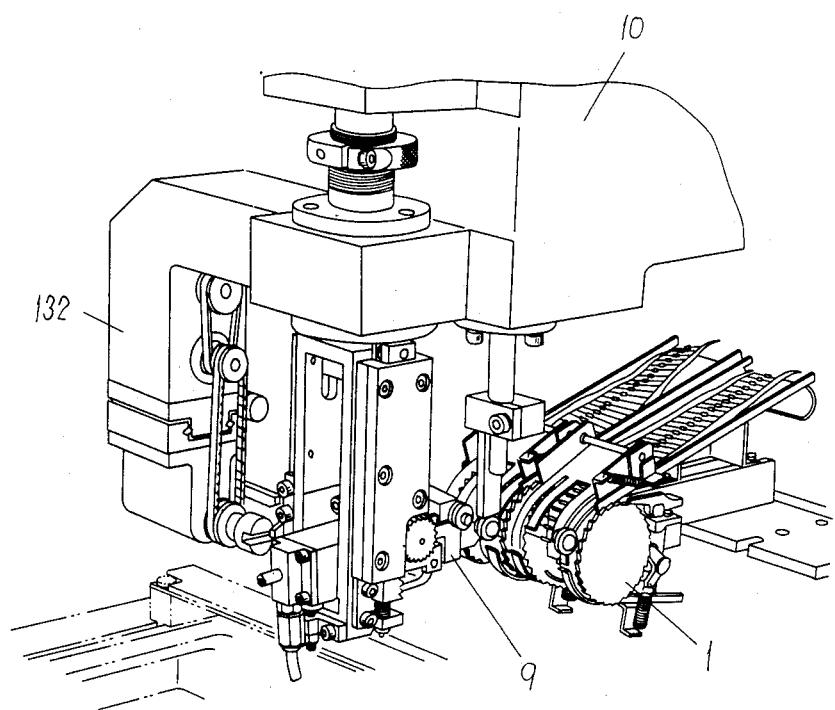
FIG. 9 is an enlarged perspective view of the principal portion of the electronic component insertion apparatus.

FIG. 9 is a perspective view, showing the relationship of the principal portions of the present invention. As described more fully below, FIG. 9 includes the external drive section 132 which is constructed and arranged to adjust the distance between the elements in insertion head 9 to allow the insertion pitch or space between the shaped leads of the component 3 to be varied.

Figure 10:
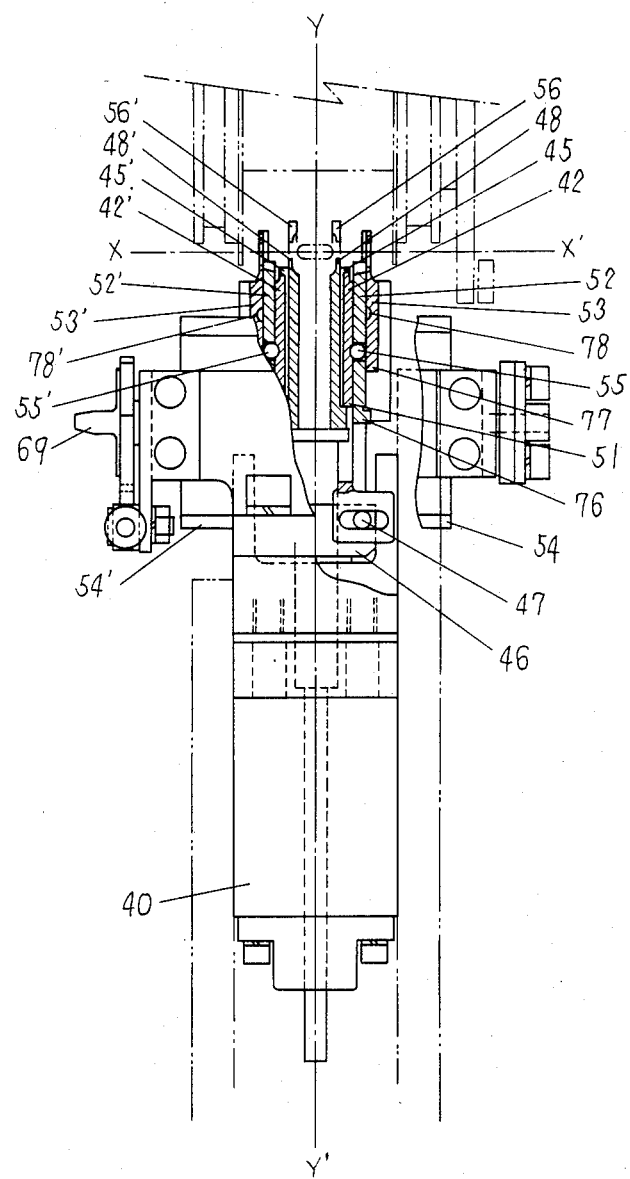
FIG. 10 is a plan view, in partial section, of the cutter portion of the insertion head of the present apparatus.
Figure 11:
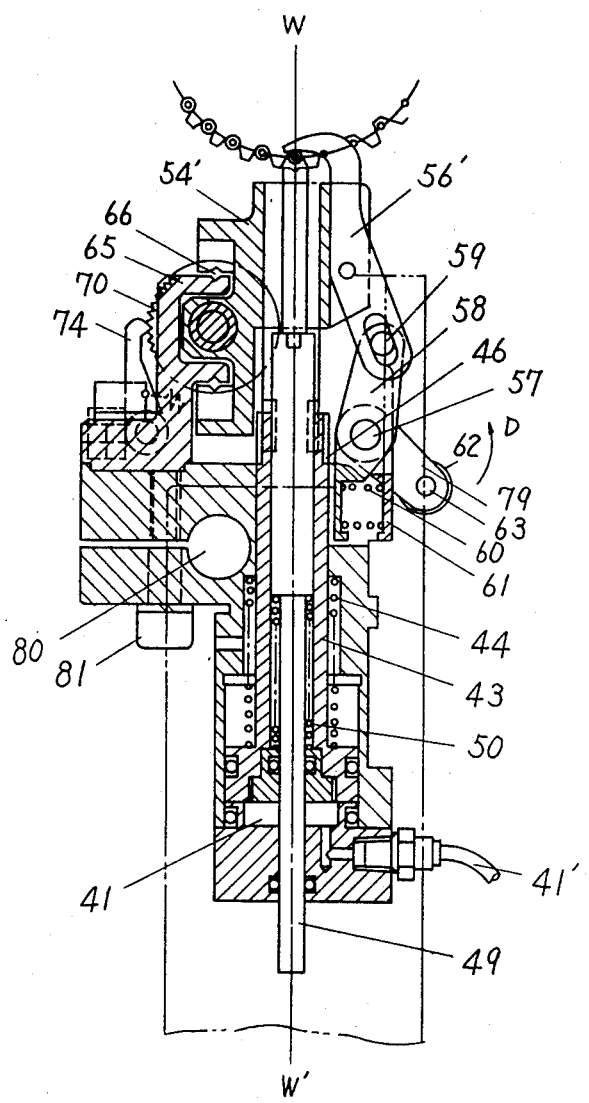
FIG. 11 is a front elevational view, in section, of the cutter unit of the present invention.
Figure 13:
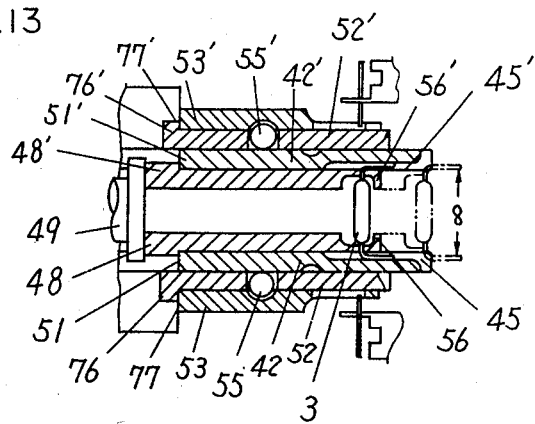
FIG. 13 is an enlarged view, in section, of the principal portion of the cutter unit.

The details of construction of the insertion head 9 are shown in FIG. 10. Specifically, cutter unit body 40 is comprised of a cylinder 41 having a piston 43 installed therein. As shown in FIG. 11, a compression spring 44 is mounted outside and coaxial with piston 43. The piston 43 has a shaping element 42 at its front end. In the front inner side of the shaping element 42, there are a pair of "U"- or "V"-shaped grooves 45, 45' which correspond to the insertion pitch q or hole spacing of the printed circuit board 12 and are located equidistant from and along the lateral center line W—W'. The other end of the shaping element has an elongated opening which is slideable in the X—X' direction with respect to a pin 47 pressed into a block 46 attached to the front end of the piston 43. Pushers 48, 48' are located inwardly of the grooves 45, 45' so that they are slideable in the Y—Y' direction. The end surfaces of the pushers 48, 48' on the Y' side extend through the piston 43 and engage the lower portion of a rod 49 by a compression spring 50 so that they are pushed to the Y side into contact with the stop portion of the shaping elements 42, 42' as shown in FIG. 13, and thereby stopped.

The front outer sides of the shaping elements 42, 42' are formed with grooves allowing male cutter blades 52, 52' to slide therein.

Figure 14:
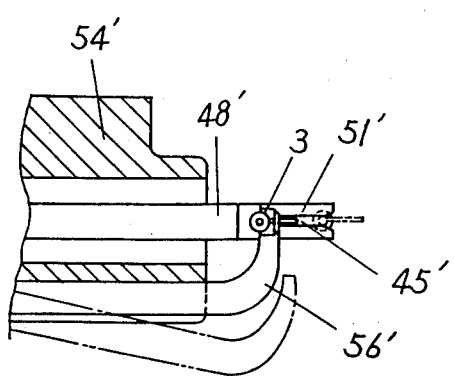
FIG. 14 is an enlarged side elevational view, in section, of the principal portion of the cutter unit.

As shown in FIGS. 10 and 14, female cutter blades 53, 53' are fixed to independent moving tables 54, 54' and hold the male cutter blades 52, 52' between the shaping elements 42, 42', forming a pair of cutters each. Steel balls 55, 55' contact the middle holes of the male cutter blades 52, 52' and enter holes having a concave surface in the grooves outside the shaping elements 42, 42'. The balls 55, 55' normally connect the shaping elements 42, 42' and male cutter blades 52, 52'.

As shown in FIG. 11, holder levers 56, 56' are respectively supported by the moving tables 54, 54', and the elongated opening of one holder lever engages a pin 59 on a lever 58 fixed to an arm shaft 57 having an arm 79 at one end and supported by the body 40. One end of the lever 58 is contacted with a spring receiver 61 fixed to the body 40 through a compression spring 60. A pin 63 carrying a roller 62 is attached to the arm 79.

The pushers 48, 48', shaping elements 42, 42', male cutter blades 52, 52' female cutter blades 53, 53', balls 55, 55' and levers 56, 56' are mounted within guides blocks 64, 64' which are fixed to the moving tables 54, 54'. The combination of the above elements form assemblies A, A' for cutting and shaping the lead wires of electrical components.

The moving tables 54, 54' are slideable in the X—X' direction through a slide base 65 fixed to the body 40 (FIG. 11) and through a roller 66, and engage screw shafts 67 (right-hand thread) and 68 (left-hand thread) supported by the slide base 65.

Figure 12:
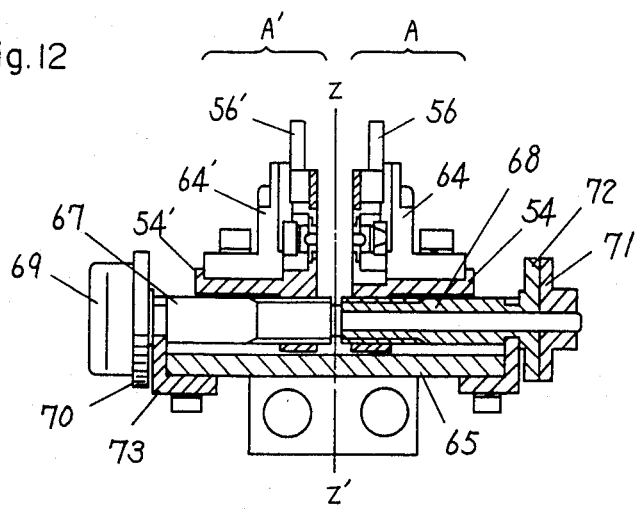
FIG. 12 is a side elevational view, partly in section, of the cutter unit.

The screw shaft 67 is provided with a knob 69 and a toothed portion 70 having teeth cut around its entire circumference. As shown in FIG. 12, flange 71 mounted on the front end of a shaft extending through the other screw shaft 68 and a flange 72 on the screw shaft 68 are free to rotate, whereby the moving tables 54, 54' can be adjusted to the zero point with respect to the center Z—Z. Once such adjustment is made, flanges 71 and 72 are clamped together by bolts (not shown).

A pawl 74 (FIG. 11) supported by a bracket 73 (FIG. 13) fixed to the slide base 65 engages the toothed portion 70 of the screw shaft 67, and the screw shafts 67 and 68 are locked by the force of a tension spring 75 supported at one end by the bracket 73.

Therefore, by rotating the knob 69 in either direction, the distance between the assemblies A, A' with respect to center Z—Z' can be changed within a predetermined range.

The insertion head 9 operates in the following manner. At the cutting position A, the lead wires 2a, 2b of an electronic component 3 which is advanced to the component feed position X—X' will be cut, with the centers of the male and female cutter blades and the X—X' and W—W' lines being adjusted so that they lie in the same plane (FIGS. 10 and 11).

In this condition, when air is fed into the cylinder 41 through an air feed hose 41', the shaping elements 42, 42' are advanced by piston 43, block 46, and pins 47, 47'. Since the pushers 48, 48' received in the shaping elements 42, 42' are connected by the compression spring 50 and the male cutter blades 52, 52' are connected by the balls 55, 55', they are advanced in a unit.

As the front ends of the pushers 48, 48' advance, they cooperate with the holder levers 56, 56' to retain the lead wires 2a, 2b of a component 3 therebetween. The force of the compression spring 60 for the holder levers 56, 56' is greater than the force of the compression spring 50 for the pushers 48, 48' and pushers 48, 48' are held in the lead wire retaining state.

Subsequently, the gap between the male and female cutter blades 52, 52' and 53, 53', respectively, becomes zero, so that the lead wires 2a, 2b of the electronic component 3 are cut, and the male blades are advanced until their step portions 76, 76' abut against the step portions 77, 77' of the female cutter blades 53, 53', so that the shaping elements 42,42' can move relative to the male cutter blades 52, 52'. The shaping elements 42, 42' alone advance until the piston 43 reaches the cylinder end (FIG. 13).

The lead wires 2a, 2b of the component 3 cut during this time are bent by the holder 56, 56' and guided by the guides 45, 45' of the shaping elements 42, 42'.

The insertion head 9, with air supplied thereto, cuts off the component 3 from the taped component assembly and holds it, with the lead wires 2a, 2b shaped into bent form.

At the time of insertion (as described fully below), when the arm 79 is rotated in the direction of arrow D (in FIG. 11), the engagement between the pushers 48, 48' and holder levers 56, 56' is canceled. The pushers 48, 48' then advance relative to the holder levers 56, 56' under the action of the compression spring 50 to push out the component 3 (see FIGS. 13 and 14).

The insertion head assembly 10 is best shown in FIGS. 1 and 15 through 18.

The insertion head assembly 10 is mounted to a hollow insertion shaft 82 which is vertically slideably supported by the insertion head body 84. A vertically slideable drive shaft 85 is located within the central bore of the insertion shaft 82. An adjusting nut 86 is attached to the middle threaded portion of the insertion shaft 82.

A steel ball 87 which is mounted one-half in a hole in the insertion shaft 82 and another half in a spherical recess of the drive shaft 85, connects the insertion shaft 82 and the driving shaft 85. At this position, the insertion shaft 82 engages the step portion 85' of the driving shaft 85.

A spherical bearing 88 is attached to the front end of a head arm 89. The inner race 90 of the spherical bearing 88 is retained in position by nuts 91, 92, thereby axially connecting the drive shaft 85 to the head arm 89 but allowing the drive shaft 85 to rotate relative to the head arm 89.

A shaft-mounted pinion 83 is provided for rotating the insertion head unit body 40. Flanges 93, 93' support the shaft portion of a shaft-mounted pinion 83 and form the right and left portion of the front end of the insertion shaft 82.

A slide rack 94 meshes with the pinion 83. A slide groove 95 allows the slide rack to slide; and a compression spring 96, interposed between the interior of the slide rack 94 and a bracket 97, constantly urges the slide rack 94 upwardly against the lower surface 98 of the head body 84 and forms the right-hand portion of the front end of the insertion shaft 82.

A slider 99 is mounted slideably in a groove 100 in the flange 93' on the insertion shaft 82, and is connected to the step portion 85' of the drive shaft 85 through a pin 101. A control block 102 is attached to the slider 99 (FIG. 16) for controlling the play of the cutter unit body 40 during insertion (to be later described). A cancelling cam is provided for rotating the arm 79 of the holder levers 56, 56' in the direction of the arrow D for releasing the clamp on the component 3. Keep plates 104 and 105 (not shown) are provided for the slider 99. A control lever 106 attached to the end of the pinion shaft 80 is adjusted and fixed in position by a set screw 107 so that it will abut against the abutment surface 102' of the control block 102 during insertion.

A stop 108 (FIG. 17a) is located adjacent the cutter unit body 40 so that when the cutter unit body 40 is rotated into its downwardly extending vertical state, the rotation is stopped by the rear end of the cutter unit body 40.

A feed shaft 109 is provided for driving the lever 18 of the tape feed unit 1 downwardly. The feed shaft 109 is vertically moved and supported by the insertion head body 84. A feed block 110, attached to the front end of the feed shaft 109 is adapted to abut against the roller 19 of the lever 18 during insertion. A pin 111 connects the feed shaft 109 to a feed arm 112. A compression spring 113 interposed between the insertion head body 84 and the feed shaft 109, constantly urges the latter downwardly.

In addition, the head arm 89 and feed arm 112 are given a vertical movement around the axis of a pin 115 supported by a bracket 114 attached to the upper portion of the head body 84, by an insertion plate cam 119 and feed plate 120 attached to a cam shaft 118 through cam followers 116 and 117, respectively. Further, the head arm 89 and feed arm 112 are caused to move vertically in conformance to the cam surface of the feed plate cam 120 by a pull cylinder 121 and compression spring 113, respectively.

Figure 17:
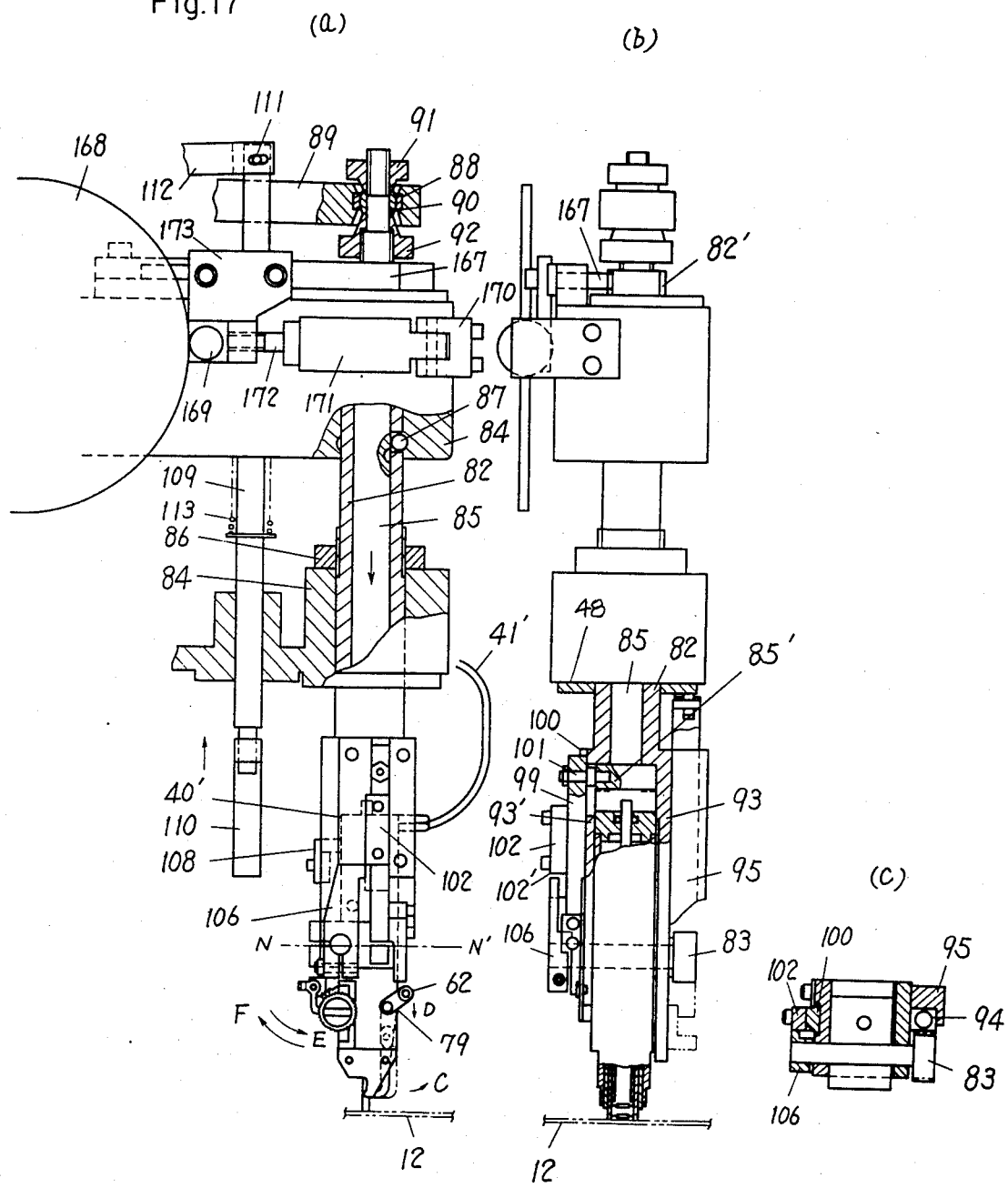
FIG. 17a is a side elevational view of the insertion head in the insertion position from the same side as shown in FIG. 16.
FIG. 17b is a front elevational view, in partial section, of the insertion head.
FIG. 17c is a sectional view taken along the line n—n' in FIG. 17a, looking downwardly.

Rotation of the insertion head 9 about an axis perpendicular to the plane of the printed circuit board is accomplished by the slide movement of a rack 167 meshing with a pinion 82' connected to an upper part of the insertion shaft 82 (FIG. 17). The rack 167 is fixed to bracket 173 which slides according to the shape of cam 168 through roller 169. The bracket 173 is biased by rod 172 of cylinder 171 supported by the insertion head body 84 with bracket roller 169 to a surface of the cam 168 and the cam 168 is rotated, the rack 167 slides to rotate the insertion shaft 82 which in turn causes the insertion head 9 to rotate. Thus, an electrical component can be inserted into the printed circuit board in an orientation rotated about an axis perpendicular to the plane of the printed circuit board.

Figure 15:
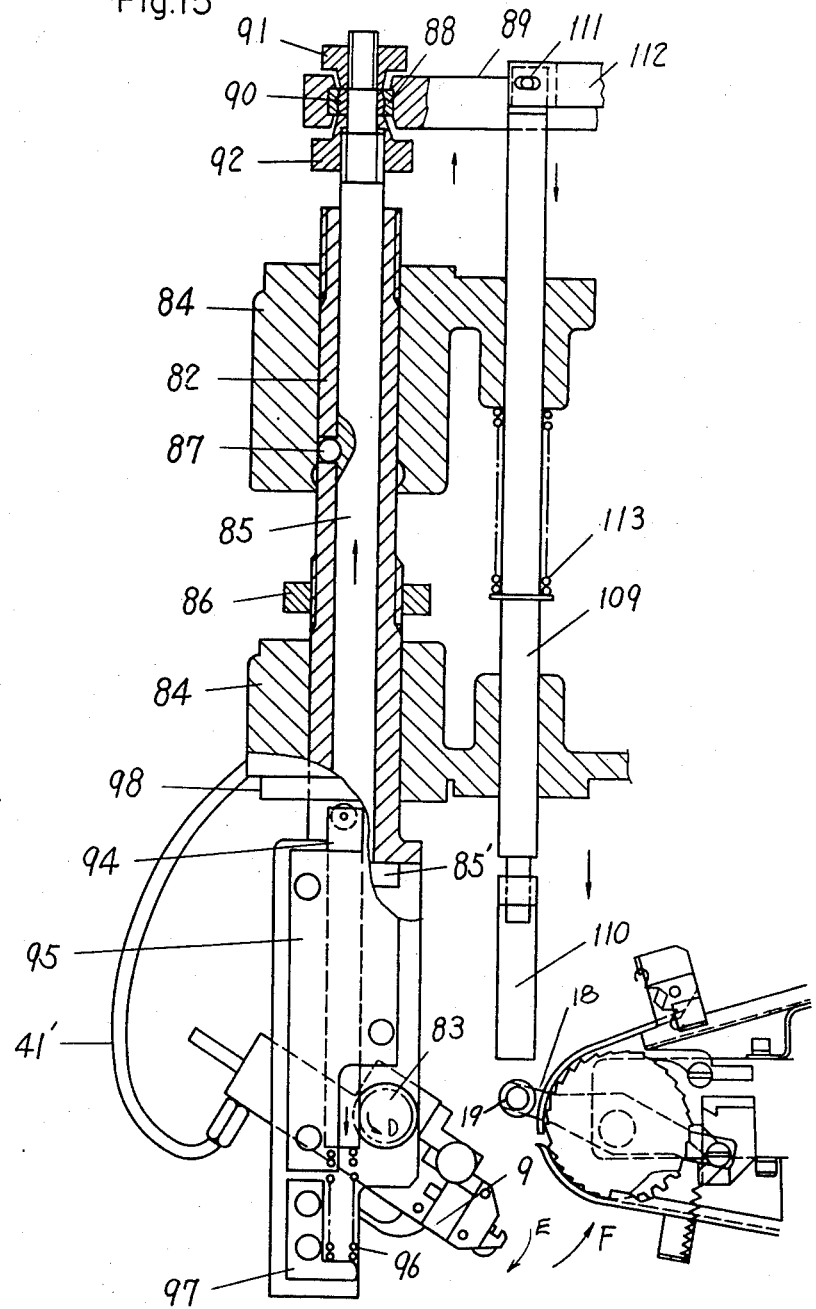
FIG. 15 is a right side elevational view, in section, of the insertion head.
Figure 16:
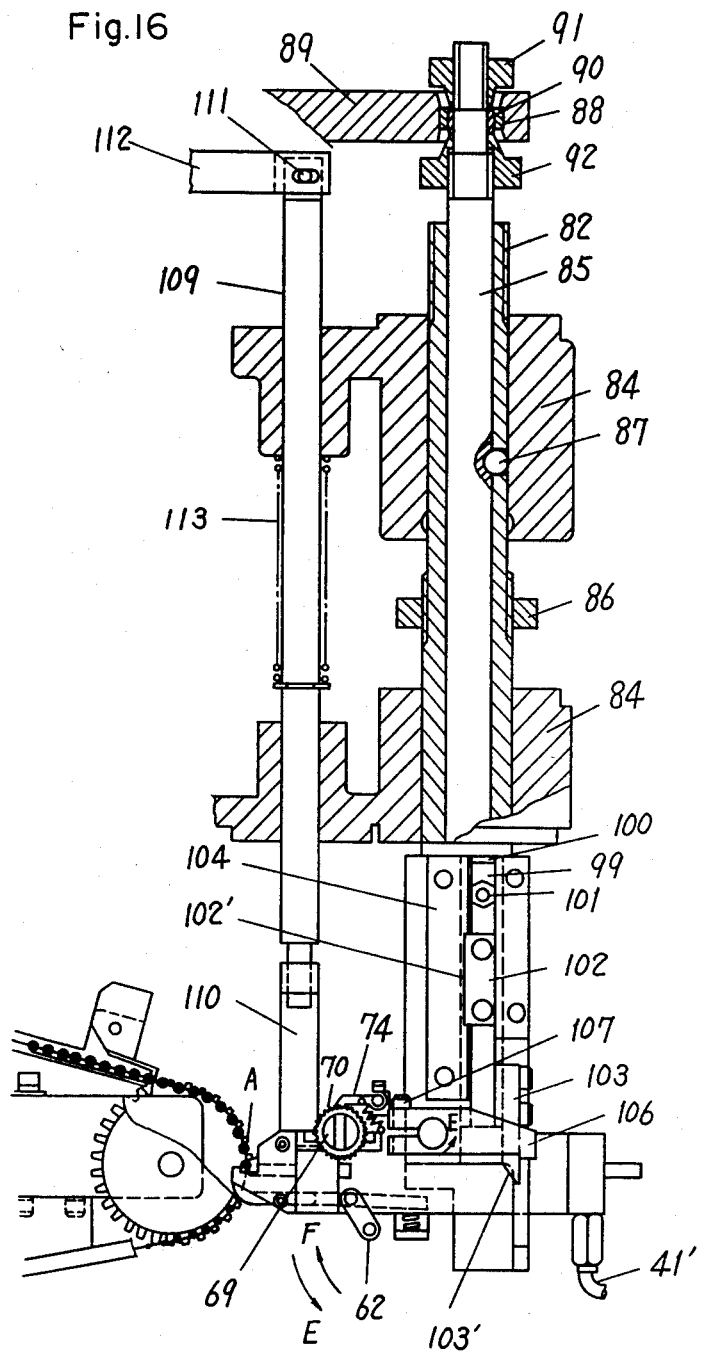
FIG. 16 is a left side elevational view, in section, of the insertion head.

The operation of the drive shaft 85, insertion shaft 82 and cutter unit 9 caued by the insertion plate cam 119 is best shown in FIGS. 15, 16 and 17.

When the cutter unit 9 is at the origin (start) position 0—0 shown in FIG. 15, it is at a position downwardly inclined at an angle of 30° to 60° where it is out of danger of collision with the tape feed unit 1.

The insertion plate cam 119 begins to rotate, lifting the drive shaft 85 until the upper dead point of the cam is reached. As the drive shaft 85 is lifted, the insertion shaft 82, which is engaged by the step portion 85' of the drive shaft 85, is also lifted. The pinion shaft 83 supported by the front end flanges 93, 93' of the insertion shaft 82 is turned counterclockwise (in the direction of arrow F in FIG. 15) due to this lifting movement. Since the slide rack 94 meshing with the pinion shaft 83 is in contact with the lower surface 98 of the head body, the insertion head 9 is rotated counterclockwise until the upper dead point of the insertion plate cam 119, where it is brought to its horizontal state. With this position taken as the cutting position A (FIG. 16), if the positional relation between the tape feed unit 1 and the cutter unit 9 is as shown in FIGS. 10 and 11, the component 3 fed to the component feed position X—X' from the tape feed unit 1 can be cut off from the tapes, shaped and held by supplying air to the cylinder 41, as described above (FIGS. 13, 14 and 16).

When the component 3 is held by the insertion head 9, the drive shaft 85 begins to descend and the insertion shaft 82, which is connected to the drive shaft 85 by ball 87, also begins to descend.

When this lowering movement is started, the slide rack 94, which is urged upwardly by the compression spring housed therein, is pushed upwardly relative to the lowering stroke, rotating the pinion 83 meshing with the rack 94 in the direction E as shown in FIGS. 15 and 16, with the result that the cutter unit body 40 is also rotated to the vertical position. The legs 2a, 2b (lead wires) of the component 3 are positioned above the printed circuit board, the rear end 40' of the cutter unit body 40 abuts against the stop 108, thus assuming an orientation for insertion of the component as shown in FIG. 17a. When the insertion shaft 82 is lowered vertically through a fixed distance from this position, the adjusting nut 86 strikes the insertion head body 84 to stop the lowering of the insertion shaft 82. When the adjusting nut 86 abuts the insertion head body 84, if the front ends of the shaping elements of the insertion head 9 are adjusted to contact the upper surface of the printed circuit board, the guide grooves 45, 45' of the shaping elements can be brought to the insertion holes. At this position, the ball 87 moves to a spherical recess formed in the insertion head body 84 and the connection between the insertion shaft 82 and the driving shaft 85 is released.

Even after the insertion shaft 82 stops lowering, the drive shaft 85 continues to lower, and the slider 99 connected by the pin 101 also lowers along the groove 100 of the flange 93'. During this lowering stroke, the control surface 102' of the control block 102 attached to the slider 99 immediately contacts the control lever 106, locking the cutter unit body 40 against further rotation and causing the holder levers 56, 56' to rotate in the direction of arrow C in FIG. 17a by the cam surface 103' of the cam block 103 through the roller 62 on the arm 79 mounted on the arm shaft 57, thereby releasing the component 3 (FIGS. 13 and 14).

When the holder levers 56, 56' release the component 3, the pushers 48, 48' push the component 3 out of the insertion head 9, downwardly by the force of the compression spring 50, as described above, causing the lead wire guides 45, 45' of the shaping elements, already guided to the location for insertion into the printed circuit board, to guide and insert the lead wires 2a, 2b of the component 3.

To push out the component reliably, the rear end of the rod 49 of the pushers 48, 48' is moved downwardly by the step portion 85' of the drive shaft 85 until insertion is completed.

When the drive shaft 85 reaches the lower dead point and the electronic component 3 is fully inserted, the supply of air to the cylinder 41 of the cutter unit body 40 is interrupted and the piston 43 is allowed to return to its original position.

When the lower dead point is passed, first the drive shaft 85 alone begins to ascend, performing the operation reverse to that for lowering of the step portion 85', the ball 87 moves to the spherical recess of the driving shaft 85, and then the insertion shaft 82 is arrested by the step portion 85', so that the drive shaft 85 and the insertion shaft 82 begin to ascend simultaneously. Then the rack 94' again comes in contact with the lower surface 98 of the head body, and the pinion 83 and cutter unit body 40 are rotated couterclockwise to return to the origin position, thereby completing one cycle of the inserting operation.

Figure 18:
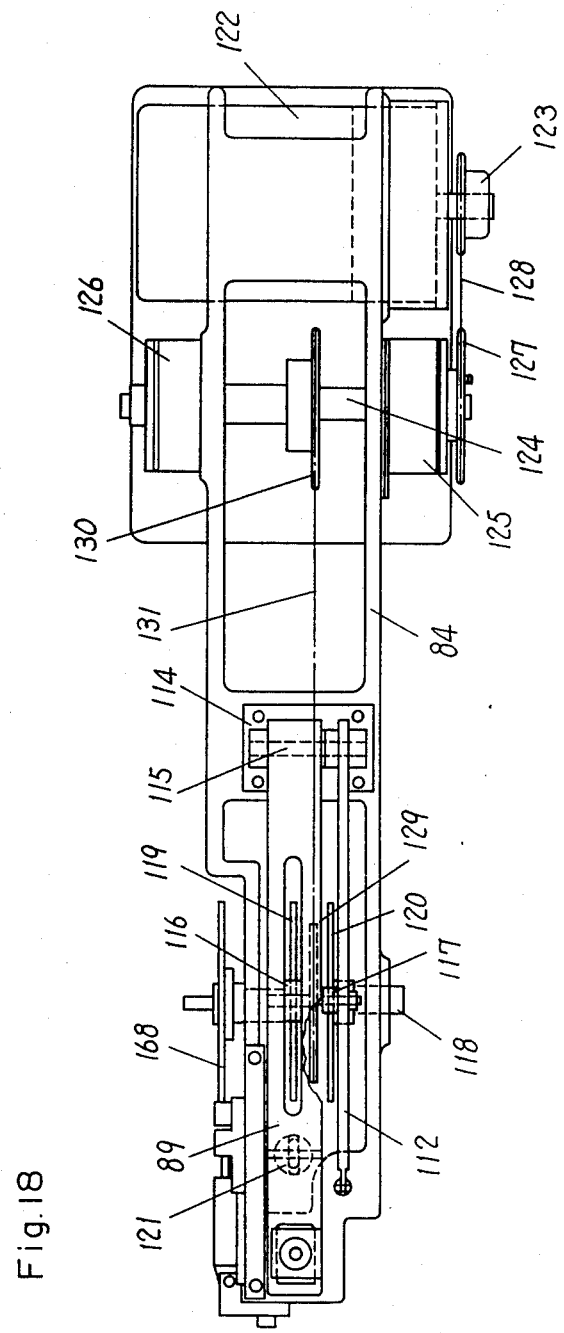
FIG. 18 is a plane view of the insertion head body.

The vertical reciprocation of the insertion head assembly 10 will now be described with reference to FIGS. 8 and 18. A geared motor 122 is attached to the head body 84 as shown in FIG. 18. The geared motor 122 has an output shaft and a sprocket 123 attached to the output shaft. A transmission shaft 124 is mounted within the head frame 84 and has a clutch 125 and a brake 126 on its opposite ends. A sprocket 127 attached to the clutch 125 is connected to the geared motor 122 by a chain 128 around sprocket 123. A sprocket 130 is fixed to the transmission shaft 124 which in turn is attached to a sprocket 129 mounted on the cam shaft 118. Sprockets 129 and 130 are interconnected by a chain 131. When the clutch 125 is engaged, the rotation of the geared motor 122 is transmitted to the cam shaft 118, and as the latter is rotated, the inserting operation including the feed of said tape feed unit 1 and the movement of the insertion shaft 82 is performed.

Figure 19:
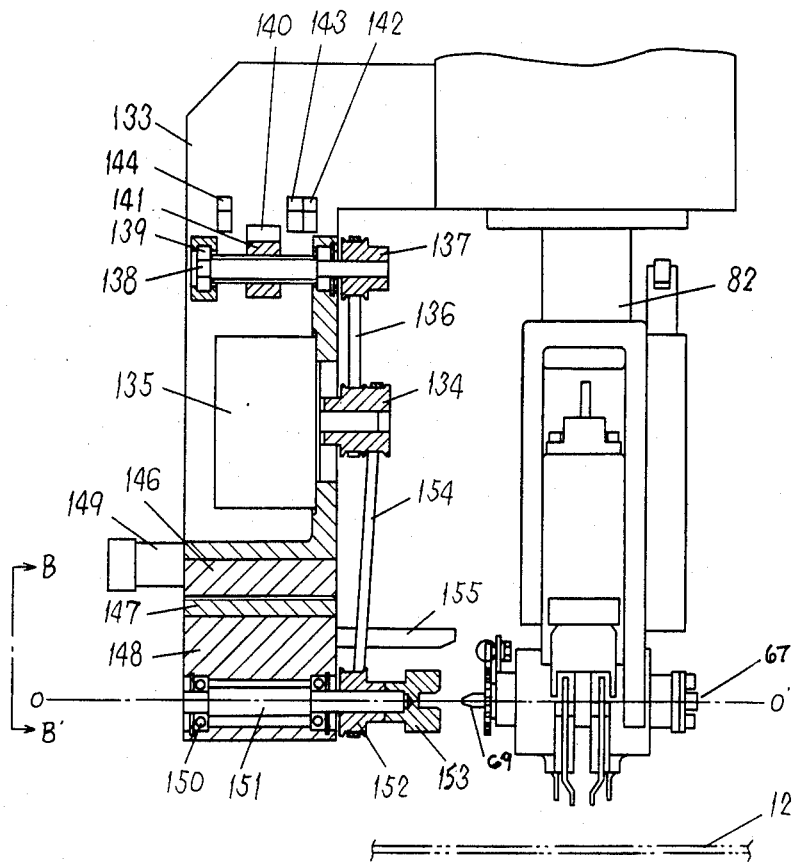
FIG. 19 is a front elevational view, in section, of the drive section for changing the pitch width of the cutter unit.
Figure 20:
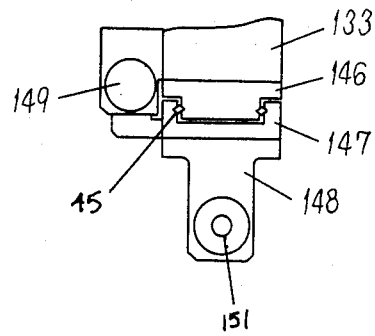
FIG. 20 is a fragmentary view of the bottom portion of the drive section taken in the direction of the arrows on line B—B' in FIG. 19.

The details of construction of drive section 132 of the component insertion apparatus of the present invention which changes the insertion pitch q or the distance between the assemblies A, A' of the insertion head 9 will now be described with reference to FIGS. 19 and 20.

The frame 133 of the drive section 132 is attached to the insertion head body 84 of the head assembly 10. A pulse motor 135 is mounted to the frame 133. The pulse motor 135 has a double toothed pulley 134 mounted thereon. A threaded shaft 138 having a toothed pulley 137 is mounted on the frame 133 above the pulse motor 135 and is rotated by a toothed belt 136 connecting toothed pulling 137 to the inside of double toothed pulley 134. The threaded shaft 138 is supported in bearings 139 mounted on the frame 133 and carries on its threaded portion a movable block 141 having a detection piece 140. Attached to the frame 133 along the path of travel of the detection piece 140 are sensors for detecting the detection piece 140, i.e. sensor 142 (for overrun), sensor 143 (for origin position) and sensor 144 (for overrun).

At the bottom of the frame 133, there are slide bases 146 and 147 with rollers 145 therebetween. A frame 148, attached to the movable base 147, has a bearing portion coaxial with the screw shaft 67 of the cutter unit 9 at the origin postion (0—0') of the insertion head assembly 10, shown in FIG. 19. The movable base 147 together with the frame 148 is caused to reciprocate through a predetermined stroke toward the insertion shaft 82 by the cylinder 149 attached to the frame 133.

The bearing portion of the frame 148 carries therein a rotary shaft 151 mounted in bearings 150. The rotary shaft has a toothed pulley 152 with a connector disk 153 having a groove mounted thereon. The pulley is driven by a toothed belt 154 connecting the outside half of the double toothed pulley 134 of the pulse motor 135.

Further, the frame 148 has a guide bar 155 fixed thereto which, when the frame 148 is advanced, opens the pawl 74 locking the assemblies A, A' of the insertion head 9 against their movement. The operation of the pawl 74 is described above with reference to FIGS. 11 and 13.

The related operation of the insertion head assembly 10 and the insertion head 9 will now be described.

When the insertion head assembly 10 completes the insertion of all the electronic components 3 having the initially determined insertion pitch, the insertion shaft 82 stops at the origin position (0—0') where the insertion head 9 is oriented at a position downwardly inclined at an angle of 30° to 60° as shown in FIG. 15. The air cylinder 149 of the drive section 132 advances the frame 148, the guide bar 155 opens the pawl 74 of the insertion head 9 to unlock the screw shaft 67 (FIG. 12) and concurrently therewith the groove of the connector disk 153 receives the knob 69 of the screw shafts 67, 68 to interconnect the rotary shaft 151 and screw shafts 67, 68. The data on the insertion pitch for the next insertion is transferred from the control section 13 to the pulse motor 135, whereby the latter is rotated to give the predetermined rotational value to the rotary shaft 151 through the screw shafts 67, 68 so as to change the distance between the assemblies A and A' to adjust the insertion pitch q to the appropriate distance. Upon completion of change, the air cylinder 149 is actuated to retract the frame 148, so that the guide bar 155 leaves the pawl 74. The pawl 74 then locks the toothed portion 70, and the groove of the connector disk simultaneously leaves the knob 69.

The distance between the assemblies A and A' of the insertion head 9 is thus changed, and the insertion of the electronic component 3 with the insertion pitch having this distance can be accomplished. Thereafter, if a plurality of insertion pitches are required, the operation described above is repeated.

The direction in which the groove of the connector disk 153 and the knob 69 engage each other is adjusted by locating the origin with respect to each other. Since pawl 74 prevents rotation of screw shafts 67, 68 and knob 69, there is no possibility of deviation during the non-operation mode.

Figure 3:
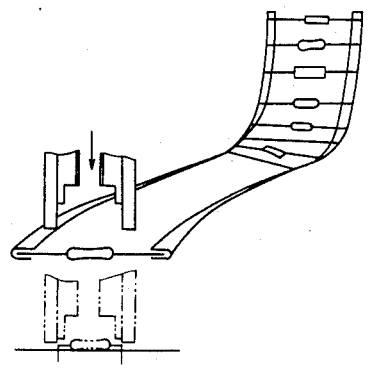
FIG. 3 is a schematic view illustrating a conventional method of inserting electrical components.

The X-Y table or board moving section 11 is best described by reference to FIG. 3. A movable base 156 on the apparatus frame 29 supports the X-Y table 11. A Y-direction slide shaft 157 is fixed to the base 156. A Y-table 158 is slidable on the slide shaft 157. A pulse motor 159 attached to the base 156, directly engages a ball screw 160 and a ball nut which is fixed to the Y-table 158. Rotation of the ball screw 160 causes the Y-table 158 to move. Similarly, a slide shaft 162 is fixed on the Y-table 158, and an X table 163 is slidable on the slide shaft 162. Another pulse motor 164 is attached to the Y table, and a ball screw 165 and a ball nut 166 are used to drive the X-table. The ball screw 165 is directly connected to the pulse motor 164 and the ball nut 166 is fixed to the X table 163.

Figure 21:
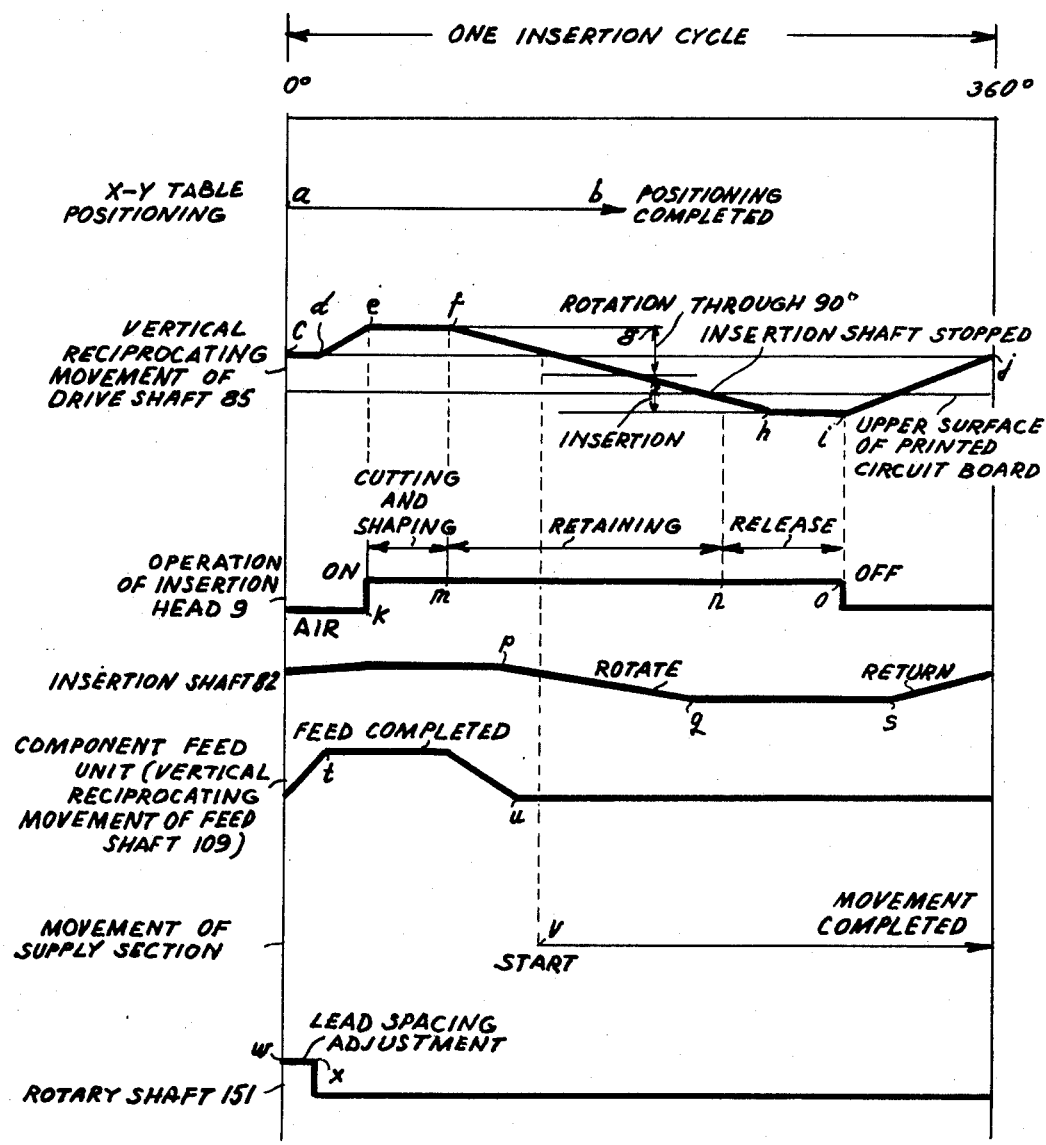
FIG. 21 is a timing chart showing of cycle of the operation of an embodiment of the electronic component insertion apparatus of the present invention.

In order to more fully understand the coordination of the operations of the various aspects of the component insertion apparatus of the present invention reference will be made of FIG. 21 which is a timing chart showing one complete cycle of operation. A cycle is defined as the operation of the component insertion apparatus from the orientation of the insertion head 9 at the origin position 0—0' with the insertion head 9 inclined downwardly at an angle of 30° to 60° as shown in FIGS. 1, 8, 15 and 19 until the insertion head 9 returns to such origin position. A cycle includes adjustment of the insertion head 9 to change lead pitch (when required), the feed of an electronic component 3 into the insertion head 9, the cutting and bending of the component, the rotation of the insertion head about an axis perpendicular to the printed circuit board (when required), the insertion of the component into the printed circuit board and the return of the insertion head 9 to the origin position 0—0'. During the cycle the X-Y table 11 locates the preformed apertures in the printed circuit board 12 in proper orientation relative to the insertion head 9.

At the start of the cycle at the position designated (at 0° on the chart of FIG. 21), the X and Y tables 158, 163 are first caused to move to the position selected by the drive control section 13 where the preformed apertures in the printed circuit board 12 are aligned with the insertion head 9. By the time in the cycle designated b, the X and Y tables have completed the orientation of the printed circuit board 12.

Simultaneous with the positioning of the X and Y tables 158, 163, the drive shaft 85 reciprocates causing the insertion head 9 to rotate about the shaft mounting pinion 83. At the start of the cycle at point c, the insertion head 9 remains in the origin position 0—0' shown in FIG. 19. The insertion head 9 remains in this orientation until point d. During this dwell period, the insertion pitch q may be adjusted as discussed below. As the cylce advances to point e, the insertion head 9 is caused to rotate about the shaft mounting pinion 83 in the direction F shown in FIG. 15 until reaching the feed and cutting position A shown in FIG. 16. The insertion head 9 remains in position A from point c to point f in the cycle. Thereafter, the downward movement of the drive shaft causes the insertion head 9 to rotate from the cutting A shown in FIG. 16 (point f) downwardly (in the direction E) approximately 90° to the insertion orientation shown in FIG. 17a (point g). The drive shaft 85 continues to move downwardly to point h while the component 3 is inserted into the printed circuit board 12, remains at its lowest position i and thereafter returns to its vertical position at point j for the start of the next cycle.

The cutting and bending operation of the insertion head 9 is controlled by air pressure. At the start of the cycle the air supply is "off". At point k the air supply is turned "on" and the insertion head 9 cuts and shapes (bends) the leads 2a, 2b of the component 3 until point m. From point m to point n the component is retained in the insertion head 9 (through the insertion operation) and from point n to point o, where the air supply is turned off and the component 3 is released. The air remains off until point k of the next cycle.

Next, the timing chart shows rotation of the insertion shaft 82 and the attached insertion head 9 about a plane perpendicular to the plane of the printed circuit board 12. At the point designated p, which is after the feed of the component is completed (as discussed below) the insertion head 9 rotates through a preselected angle in accordance with the instructions from the drive control section 13. Rotation must be completed by the point q which corresponds in the cycle to the time at which the insertion head reaches the upper surface of the printed circuit board 12. The insertion head 9 and insertion shaft 82 remain rotation until point s when the insertion head is above the upper surface of the printed circuit board. As such time the insertion head 9 rotates back to its initial position for the next cycle.

Next, the operation of the component feed unit 1 will be discussed. The feed shaft 109 reciprocates vertically to advance a component 3 to the feed position. Specifically, prior to the start of the cycle each feed unit, has a component 3 in a position one pitch short of the cutting position A. Concurrently with the insertion head 9 moving toward the cutting position A (point e) the feed shaft 109 is displaced downwardly causing pusher 110 to depress lever 18 of the tape feed unit 1 and a component 3 to reach the X—X' line at the point designated t before the insertion head 9 reaches the A position. Thereafter the feed shaft 109 moves upwardly reaching its initial position by point u.

The present invention includes a plurality of feed units 1 mounted on a reciprocal unit moving table 7 with each feed unit 1 supply a different component. Thus, it may be necessary to locate a different feed unit 1 adjacent the insertion head 9 before the next insertion cycle begins. Once the feed shaft 109 has returned to its initial position (point u), the supply section can move the appropriate feed unit 1 to the feed position starting at point v.

The lead pitch is adjusted in accordance with the instructions of the drive control section 13 during the beginning of each cycle. Specifically, rotary shaft 151 can engage knob 69 on lead screw shafts 67, 68 to accomplish the necessary adjustment of the tool spacing in the insertion head 9 during the time period from the point designated w to the point designated x. Such adjustment must be accomplished prior to point d when the insertion head 9 starts to rotate away from the origin position.

Since the various operations discussed above can be carried on simultaneously the cycle can be performed in a short time frame allowing the apparatus of the present invention to operate at a high rate of insertion. Since the insertion head 9 rotates rapidly about the shaft mounted rack 83 through an angle of approximately 30° to 60° in one direction and then 90° in the other and also rotates simultaneously about an axis perpendicular to the plane of the printed circuit board it is particularly advantageous to minimize the weight and resultant inertia of the insertion head 9. By mounting pulse motor 135 remote from the insertion head 9 it is still possible to retain the ability to adjust the insertion pitch without requiring a heavey insertion head 9.

While this embodiment has been described with respect to an electronic component having lead wires axially extending from the body, it should be apparent that the variable pitch feature is applicable also to a component composed of a lead wire alone, or the so-called jumper wire. Further, while the unit moving table 7 has been adapted to be linearly moveable in this embodiment, the tape feed units 1 may be arranged on the outer periphery of a disk so that they are capable of rotary movement.

The electronic component insertion apparatus of the present invention utilizes a plurality of separate feeding units for providing components to the insertion head. Thus, there is no need to arrange components in sequential order. Instead, during each cycle the insertion head 9 goes to the appropriate feed unit to receive an electronic component held by the tapes in that feed unit. The component is cut, its leads shaped and it is inserted in a predetermined position in the printed circuit board. If the particular component is larger or smaller than the prior component and it is desirable to charge the spacing between the bent leads (the insertion lead pitch), pitch change means are provided in the insertion head which allow the insertion head to be adjusted automatically in response to the device control section. In the present invention, the insertion pitch is adjustable by an electric motor which is located away from the insertion head allowing the insertion head to be relatively small and light weight.

Additionally, the present invention allows the insertion head to rotate around an axis substantially perpendicular to the printed circuit board. Thus, there is no effective limitation on the orientation in which the electronic components can be inserted. Such feature allows increased component density on a printed circuit board.

The invention herein has been described with reference to particular embodiments and it is to be understood that these embodiments are merely illustrative of the principles and application of this invention. Thus, it is to be understood that numerous modifications may be made in the illustrative embodiments and other arrangements without departing from the spirit and scope of this invention and, accordingly, the appended claims should be broadly construed.

We claim:

1. In an apparatus for processing electronic components having a pair of axially projecting leads by cutting and bending the leads and thereafter inserting said leads into a corresponding pair of preformed holes in a printed circuit board in a particular, preselected location and orientation relative to said board comprising a head for working the leads of the component and for inserting the worked leads into the printed circuit board, including first and second sets of lead working and inserting tools, means mounting said sets of tools in said head for adjustment relative to each other about a centerline of said head in accordance with the required spacing between said corresponding pairs of preformed holes in the printed circuit board, means on said head and operatively connected to said sets of tools for adjusting the spacing between the same during selected cycles of the machine, a machine control for moving said head between a standby position, to a feed position in which said head receives a component for lead working and subsequent insertion of the leads into the printed circuit board, and to an insertion position wherein the lead inserting tools are oriented relative to the printed circuit board for insertion of the leads into the printed circuit board, the improvement comprising: a tool spacing adjustment drive, means mounting said drive on said machine remote from said head, means for moving said drive between a clearance position removed from the path of movement of said head and an operative position in engagement with said head when said head is in said standby position, said drive including means operatively connected to said tool adjusting means in said head when said head is in said standby position for connecting said drive to said tool spacing adjustment means whereby the spacing between the first and second sets of lead working and insertion tools is adjusted to correspond to the spacing between the corresponding preformed holes in the printed circuit board.

2. The apparatus as recited in claim 1 wherein in said tool adjustment means in said head comprises a screw shaft engaged in each of said first and said second sets of lead working and insertion tools whereby rotation of said screw shaft causes both said first and said second sets of lead working and insertion tools to move toward or away from each other about a centerline.

3. The apparatus as recited in claim 1 wherein the improvement further includes self locking means for retaining the tool spacing adjustment drive and said first and second sets of lead working ends and inserting tools in the adjusted position when said drive is in said clearance position.

4. The apparatus as recited in claim 3 wherein the improvement further includes means associated with said tool spacing adjustment drive for releasing said self locking means when said tool spacing adjustment drive means is in said operative position in relation to said head.

5. The apparatus as set forth in claim 1 wherein the improvement further includes a plurality of feed units moveable relative to said insertion head when said insertion head is in an insertion position prior to a feed position whereby a preselected feed unit is provided adjacent said head before said head is in said feed position and said head receives a preselected component for lead working and insertion.

6. The apparatus as recited in claim 1 wherein the improvement includes means mounting said head for rotation of said head about an axis substantially perpendicular to said printed circuit board for inserting said electronic components in a particular orientation in said printed circuit board.

7. In an electric component insertion apparatus comprising a part tape or belt feed unit for effecting the intermittent feed to a predetermined lead wire cutting position, a tape or belt holding a large number of electronic parts of the same type, each of which has lead wires extending in opposite directions and coaxially of the main body of said part and attached adjacent to their ends to parallel strips of tape or belt in equidistantly spaced apart relationship with the lead wires of the adjacent parts, an insertion head including a lead wire cutter unit which is moveable between said lead wire cutting position and a lead wire insertion position where the lead wires of the electronic part are inserted into predetermined holes in a printed circuit board and which cuts the lead wires of the electronic part from said strips of tape or belt, thereby separating the electronic parts from said part tape or belt and bends the lead wires of the electric part in the same direction in parallel with the axis of said cutter unit, a lead wire insertion head including electronic part pushing means capable of vertical reciprocal movement pushing the electronic part toward the printed circuit board when said cutting unit is brought to said lead wire insertion position, a printed circuit board position device for supporting the printed circuit board and moving it in the x and y direction so that the predetermined holes may be brought to said lead wire insertion position, said insertion head including first and second sets of lead working and inserting tools mounted therein and means mounting said sets of tools in said head for adjustment relative to each other about a center line of said head in accordance with the required spacing between said corresponding pairs of preformed holes in the printed circuit board, wherein the improvement comprises means mounted remote from said insertion head for engaging said insertion head and adjusting the spacing between said first and said second sets of tools.

8. The apparatus recited in claim 7, wherein the improvement further comprises means mounting said head for rotation about an axis substantially perpendicular to the printed circuit board for inserting component into the printed circuit board in a particular orientation.

9. In an apparatus for processing electronic components having a pair of axially projecting leads by cutting and bending the leads and thereafter inserting said leads into a corresponding pair of preformed holes in a printed circuit board in a particular, preselected location and orientation relative to said board comprising a head for working the leads of the component and for inserting the worked leads into the printed circuit board, including first and second sets of lead working and inserting tools, means mounting said sets of tools in said head for adjustment relative to each other about a centerline of said head in accordance with the required spacing between said corresponding pairs of preformed holes in the printed circuit board, means on said head and operatively connected to said sets of tools for adjusting the spacing between the same during selected cycles of the machine, a machine control for moving said head between a standby position, to a feed position in which said head receives a component for lead working and subsequent insertion of the leads into the printed circuit board, and to an insertion position wherein the lead inserting tools are oriented relative to the printed circuit board for insertion of the leads into the printed circuit board, the improvement comprising: a tool spacing adjustment drive, means mounting said drive on said machine remote from said head, means for moving said drive between a clearance position removed from the path of movement of said head and an operative position in engagement with said head when said is in said standby position, said drive including means operatively connected to said tool adjusting means in said head when said drive is in said standby position for connecting said drive to said tool spacing adjustment means whereby the spacing between the first and second sets of lead working and insertion tools is adjusted to correspond to the spacing between the corresponding preformed holes in the printed circuit board and means mounting said insertion head for rotation of said insertion head about an axis substantially perpendicular to said printed circuit board for inserting said electronic components in a particular orientation in said printed circuit board.

* * * * *